US007018914B2

(12) United States Patent
Cho et al.

(10) Patent No.: US 7,018,914 B2
(45) Date of Patent: Mar. 28, 2006

(54) METHOD OF ENLARGING CONTACT AREA OF A GATE ELECTRODE, SEMICONDUCTOR DEVICE HAVING A SURFACE-ENLARGED GATE ELECTRODE, AND METHOD OF MANUFACTURING THE SAME

(75) Inventors: Chan-Hyung Cho, Anyang-si (KR); Sung-Gyu Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/780,851

(22) Filed: Feb. 19, 2004

(65) Prior Publication Data

US 2004/0169223 A1 Sep. 2, 2004

(30) Foreign Application Priority Data

Feb. 28, 2003 (KR) ..................... 10-2003-0012788

(51) Int. Cl.
*H01L 29/72* (2006.01)

(52) U.S. Cl. ...................... 438/595; 438/267; 438/306; 257/335

(58) Field of Classification Search ................ 438/585, 438/595
See application file for complete search history.

(56) References Cited

U.S. PATENT DOCUMENTS 6,169,017 B1 * 1/2001 Lee ............................ 438/585

FOREIGN PATENT DOCUMENTS

JP 2000-36594 2/2000

* cited by examiner

*Primary Examiner*—Edward Wojciechowicz
(74) *Attorney, Agent, or Firm*—Volentine Francos & Whitt pllc

(57) ABSTRACT

A highly integrated semiconductor device operates at a high speed due to low resistance at the gate electrode and minimal parasitic capacitance between the gate electrode and substrate. A gate pattern is formed on a substrate, and an insulating layer is formed over the substrate including over the gate pattern. The thickness of the insulating layer is reduced until the upper surface thereof beneath the level of the upper surface of the gate electrode. A conductive layer is then formed on the substrate, and is anisotropically etched to thereby form wings constituting a first spacer on upper sidewalls of the gate pattern. Then, the insulating layer is etched to leave a portion thereof beneath the wings. This remaining portion of the insulating layer constitutes a capacitance preventative layer that serves as a measure against the subsequent forming of a parasitic capacitor when source/drain electrodes are formed by implanting ions into the substrate and heat-treating the same.

38 Claims, 7 Drawing Sheets

METHOD OF ENLARGING CONTACT AREA OF A GATE ELECTRODE, SEMICONDUCTOR DEVICE HAVING A SURFACE-ENLARGED GATE ELECTRODE, AND METHOD OF MANUFACTURING THE SAME

BACKGROUND OF THE INVENTION

1. Field of the Invention

The present invention relates to a semiconductor device having a mushroom- or T-shaped gate electrode, and to a method of fabricating the mushroom or T-shaped gate electrode. More specifically, the present invention relates to a semiconductor device having a gate electrode whose upper surface is relatively large so as to accommodate a metal silicide, and to a method of fabricating a gate electrode wherein the upper surface of the gate electrode is enlarged.

2. Description of the Related Art

Recent sub-micron integrated circuit technology aims at continuously reducing the line width and contact area of the semiconductor device, whereby the length of the gate lines of integrated circuits is continuously decreasing. In general, shortening the gate line increases the electrical resistance of the gate line (hereinafter, referred to as line resistance), resulting in a corresponding reduction in the operating speed of the gate line. That is, the operating speed in an integrated circuit is mainly dependent on a delay time, and the line resistance and parasitic capacitance between the gate lines have a decisive effect on the delay time. Accordingly, increases in the operating speed of the integrated circuit must be achieved by reducing the line resistance or reducing the parasitic capacitance by widening the space between the gate lines.

Most of the technology has focused on decreasing the line resistance to improve the operating speed of the integrated circuit because the alternative solution of widening the space between the gate lines runs counter to the aim of achieving a high degree of integration of the integrated circuit. A recent technological trend involves the use of a polycide layer to minimize the line resistance. Specifically, a suicide layer including a metal having a high melting point is coated on an upper portion of a gate electrode formed of polysilicon, and the silicide layer is incorporated with the gate electrode by a heat treatment to form the polycide layer.

However, when the line width of the integrated circuit is less than 0.13 μm, the length and width of the gate electrode are correspondingly small, and the surface area of the gate electrode is also extremely small. Accordingly, the contact area between the gate electrode and the metal used to form the silicide layer is so small that the silicide layer is not sufficiently incorporated into the gate electrode by the heat treatment. That is, when the line width is less than 0.13 μm, the resistance of the polycide layer on the gate electrode is unstable and hence, the polycide layer does not reduce the electrical resistance at the gate electrode.

Delay time also results from the parasitic capacitance generated in a region of overlap between the gate electrode and the substrate. In the fabricating of semiconductor devices, the gate electrode is first formed of polysilicon on the substrate such that a dimension of the gate electrode conforms to the length of a channel layer under the gate electrode, and then source/drain electrodes are subsequently formed through an ion implantation process. A plurality of dopants are injected into an active region of the substrate to form the source/drain electrodes, and a heat treatment is performed for stabilizing the substrate. However, the dopants diffuse to the edge portion of the gate electrode due to the heat. Accordingly, the source and drain electrodes extend to locations beneath the gate electrode at both edge portions thereof. Accordingly, the channel layer is shortened by an amount corresponding to the amount of overlap between the gate electrode and the source/drain electrodes (short channel effect). The overlapping portion acts as a parasitic capacitor between the gate electrode and the substrate because the overlapping portion is electrically non-conductive. When an electrical current is applied to the source electrode, the parasitic capacitor is first charged and then, the current passes into the drain electrode through the channel layer. Therefore, a time delay is produced according to the time it takes to charge the parasitic capacitor. That is, the parasitic capacitance (hereinafter referred to as "overlay parasitic capacitance") reduces the operating speed of the integrated circuit. The operating speed is also reduced due to an overlay parasitic capacitor created as the result of a halo ion implantation process for preventing the diffusion of the source/drain dopants.

Ways to improve the resistance characteristic of the polycide gate electrode have been researched in connection with the fabricating of semiconductor devices having a design rule of less than 0.1 μm. For example, U.S. Pat. No. 6,169,017 (issued to Tong-Hsin Lee) discloses a technique of enlarging the upper surface of the gate electrode with which the silicide layer is to contact, whereupon the gate electrode is T-shaped or mushroom-shaped. Furthermore, Japanese Laid-Open Patent Publication No. 2000-36594 discloses a method of fabricating a polycide gate electrode, wherein polysilicon is twice deposited on a substrate such that an upper portion of the gate electrode is larger than the lower portion thereof. However, these techniques each fail to prevent the occurrence of a time delay due to the overlay parasitic capacitance between the gate electrode and substrate.

SUMMARY OF THE INVENTION

Accordingly, an object of the present invention is to provide a method of forming a gate electrode having a stable polycide layer and yet wherein overlay parasitic capacitance between the gate electrode and the substrate is minimal.

Another object of the present invention is to provide a highly integrated semiconductor device having a high operating speed, and to provide a method of fabricating the same.

Likewise, a more specific object of the present invention is to provide a semiconductor device whose gate electrode offers little resistance and yet gives rise to hardly any parasitic capacitance.

According to one aspect of the present invention, a method of forming a gate structure in a semiconductor device comprises a) forming a first insulating layer on a semiconductor substrate, forming a layer of conductive material on the first insulating layer, and patterning the first conductive layer to form at least one gate pattern, b) forming a second insulating layer on the gate pattern and substrate, c) reducing the thickness of the second insulating layer until the upper surface thereof becomes situated beneath the level of the upper surface of the gate pattern, d) forming a second conductive layer over the resultant structure, e) selectively removing portions of the second conductive layer such that a spacer of the conductive material is formed at both sides of an upper portion of the gate pattern, and f) subsequently removing portions of the second insulating layer other than those located beneath the spacer.

The thickness of the second insulating layer is preferably reduced by a chemical mechanical polishing (CMP) process followed by a wet-etch process. After the second conductive layer is formed on the second insulating layer and the gate pattern, the second conductive layer is selectively etched by an anisotropic etching process. As a result, the spacer formed by the conductive material at both sides of the upper portion of the gate pattern enlarges the surface area of the gate pattern.

According to another aspect of the present invention, a method of forming a semiconductor device comprises a) forming a first insulating layer on a semiconductor substrate, forming a layer of conductive material on the first insulating layer, and patterning the first conductive layer to form at least one gate pattern, b) forming a second insulating layer on the gate pattern and substrate, c) reducing the thickness of the second insulating layer until the upper surface thereof becomes situated beneath the level of the upper surface of the gate pattern, d) forming a second conductive layer over the resultant structure, e) selectively removing portions of the second conductive layer such that a first spacer of the conductive material is formed at both sides of an upper portion of the gate pattern, f) subsequently removing portions of the second insulating layer other than those located beneath the spacer, g) implanting ions at a relatively low concentration into the substrate at the sides of the gate pattern to form a lightly-doped source/drain region, h) forming a fourth insulating layer over the resultant structure, i) selectively removing portions of the fourth insulating layer to form a second spacer at the sides of the gate pattern, j) subsequently implanting ions at a relatively heavy concentration into the substrate at the sides of the gate pattern to form a heavily-doped source/drain region, k) subsequently heat-treating the substrate to chemically bond the dopants to the substrate, and l) forming a third conductive layer In addition, portions of the first insulating layer may be etched away with those of the second insulating layer (f) such that the surface of the substrate is exposed. In this case, a third insulating layer is formed over the entire surface of the substrate and on the enlarged gate pattern. Subsequently, the lightly concentrated ions are implanted into the substrate (g) using the gate pattern as a mask.

Preferably, the fourth insulating layer is formed (h) on the third insulating layer using a CVD or a PVD process, and is subsequently selectively etched (i) using an anisotropic etching process. The heavily concentrated ions are implanted into the substrate using the enlarged gate pattern and the second spacer as masks.

According to still another aspect of the present invention, a semiconductor device comprises a) a semiconductor substrate, b) a gate insulating layer disposed on the substrate, c) a T- or mushroom-shaped gate electrode including a main body disposed on the gate insulating layer and wings extending laterally from an upper portion of the main body, d) a capacitance preventative layer of insulating material disposed under the wings of the T- or mushroom-shaped gate electrode, e) a discrete spacer disposed at both sides of the gate electrode laterally of the capacitance preventative layer and, f) a source electrode and a drain electrode defined at opposite sides of the gate electrode.

The semiconductor substrate includes an active region defined by an isolation structure such as a shallow trench isolation structure. The gate-insulating layer is coated on the substrate in the active region. The capacitance preventative layer contacts the main body of the gate electrode and gate insulating layer.

Preferably, the main body and wings of the gate electrode comprise polysilicon, and the capacitance preventative layer is a low-temperature oxide (LTO). In addition, the semiconductor device of the present invention may further comprise an anti-diffusion layer for preventing ion dopants in the source/drain region of the substrate from diffusing into a channel region located beneath the gate electrode. The gate electrode preferably also comprises a metal silicide layer on the main body and wings thereof to thereby reduce the electrical resistance of the gate electrode. The metal silicide layer may also be disposed on the source/drain electrode to thereby reduce the electrical resistance thereof.

BRIEF DESCRIPTION OF THE DRAWINGS

The above and other objects, features and advantages of the present invention will become more readily apparent by referring to the following detailed description of the preferred embodiments thereof made in conjunction with the accompanying drawings, in which.

DETAILED DESCRIPTION OF THE PREFERRED EMBODIMENTS

The present invention now will be described more fully hereinafter with reference to the accompanying drawings.

Figure 1A:
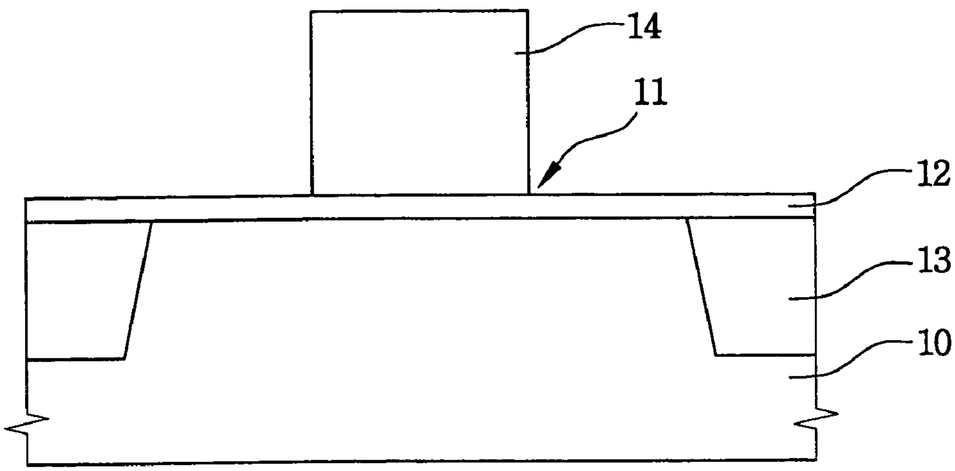
FIGS. 1A to 1M are cross-sectional views of a substrate, illustrating a method of manufacturing a semiconductor device according to the present invention.

Referring first to FIG. 1A, at least one gate pattern 14 is formed on a semiconductor substrate 10 as follows. The substrate 10 is coated with a first insulating layer 12, i.e., a gate insulating layer, and then the substrate 10 is coated with a first layer (not shown) of conductive material. Next, the first conductive layer is patterned to thereby form the gate pattern 14 on the substrate 10. Therefore, the gate pattern 14 is electrically insulated from the substrate 10 by the first insulating layer 12. A plurality of transistors are disposed on the substrate 10, and are electrically isolated from each other by an isolation structure 13. The isolation structure 13 defines an active region 11 of the substrate 10 in which the transistors operate. Current cannot pass through the isolation structure 13, which constitutes a field region or a non-active region of a substrate, so that the active region 11 is electrically isolated from an adjacent active region. The isolation structure 13 is formed by a shallow trench isolation process, for example.

The first insulating layer may be a layer of silicon dioxide ($SiO_2$). The gate pattern 14 may comprise polysilicon. The polysilicon, from which the gate pattern 14 is formed, may be deposited on the substrate using a conventional deposition process.

Figure 1B:
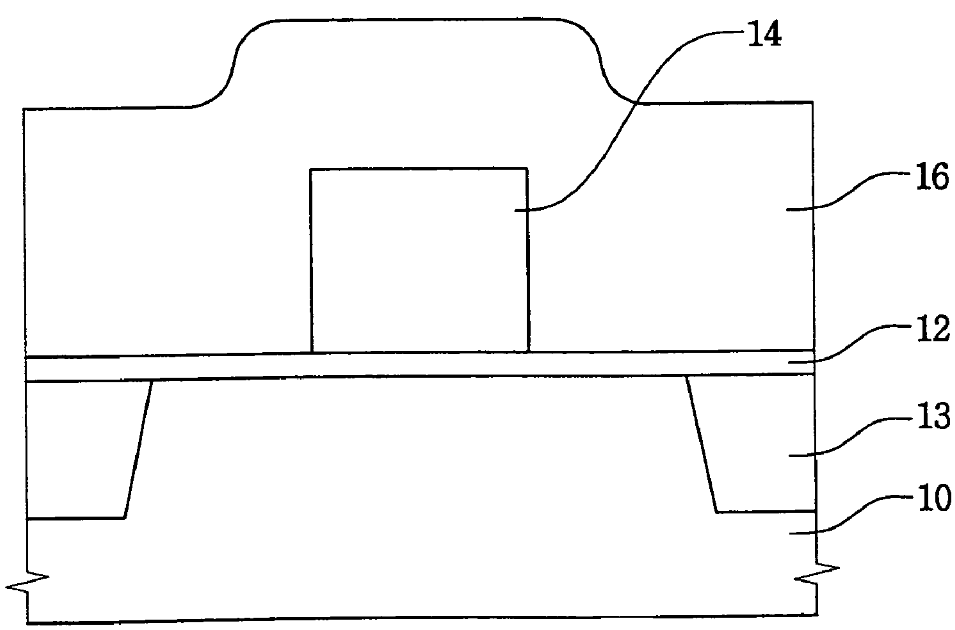

Referring to FIG. 1B, a second insulating layer 16 is formed over the entire surface of the substrate 10. Accordingly, the second insulating layer 16 covers the gate pattern 14 and the surface of the substrate 10 in the active region 11. As an example, the second insulating layer 16 may be a low temperature oxide layer (hereinafter, referred to as an LTO layer), deposited to a thickness of about 3000 Å using a chemical vapor deposition (CVD) process or a plasma-CVD process.

Figure 1C:
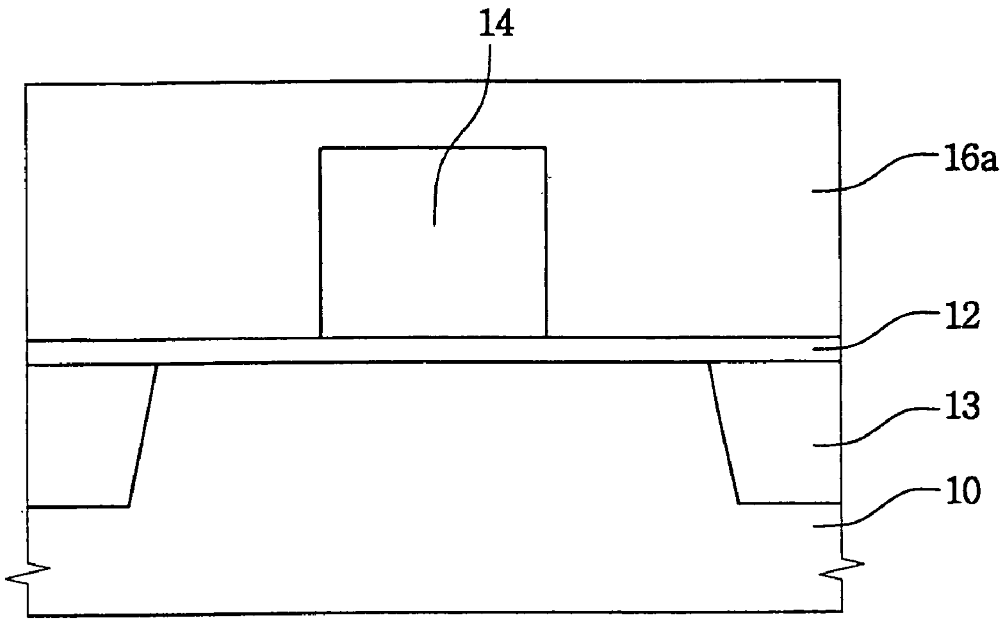
Figure 1D:
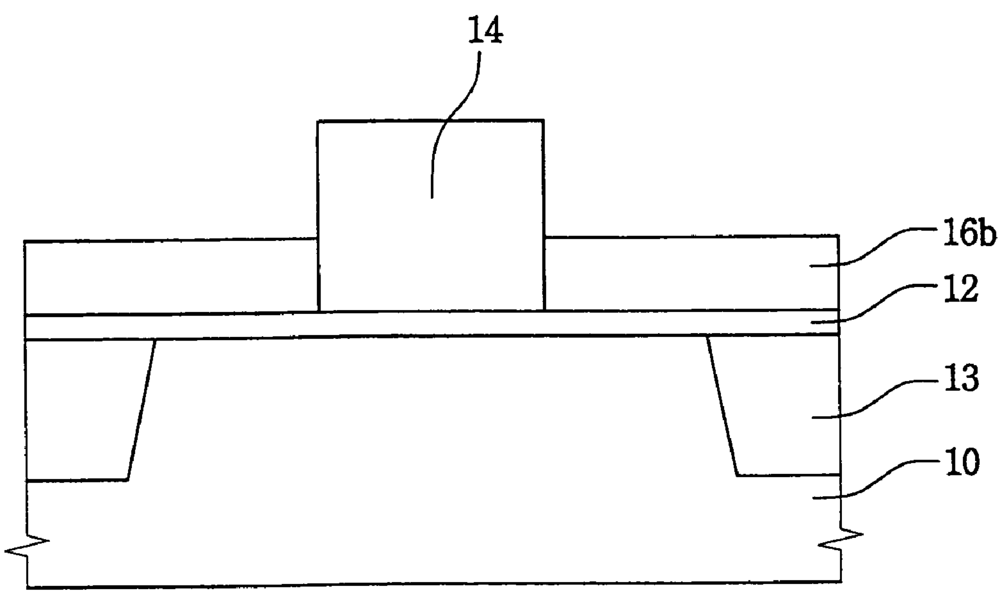

Then, as shown in FIG. 1C, the second insulating layer 16 is planarized by a chemical mechanical polishing (CMP) process to reduce the thickness of the second insulating layer 16 until the upper surface thereof is situated about 700 Å over the upper surface of the gate pattern 14. Subsequently, the planarized second insulating layer **16*a* is etched using a wet-etching process to reduce the thickness thereof to about 900 Å from the upper surface of the insulating layer 12, as shown in FIG. 1**D. As an example, the wet-etching process uses limulus amoebocyte lysate (LAL) solution as an etchant.

Figure 1E:
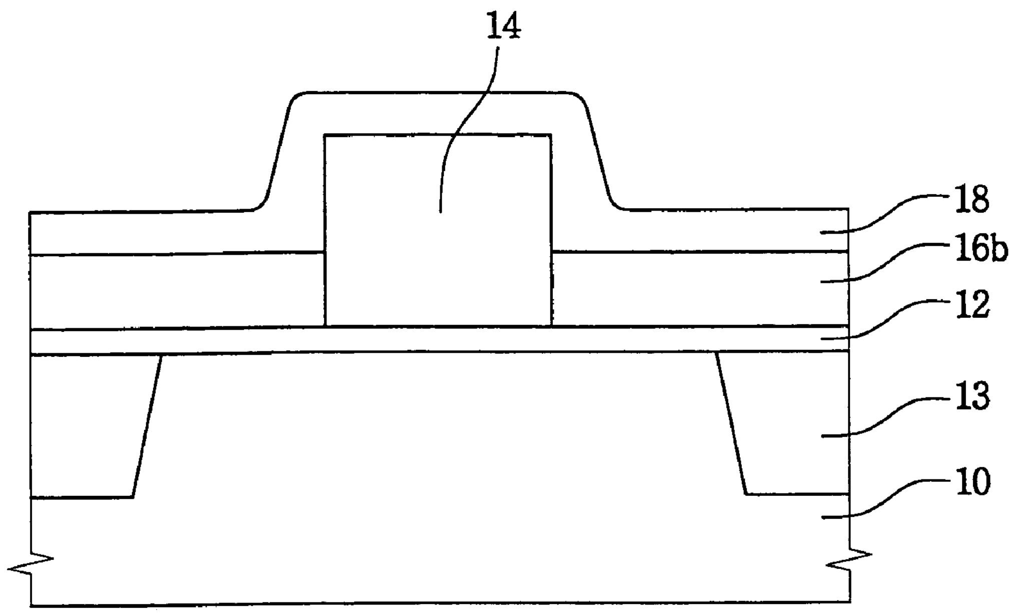

Referring to FIG. 1E, a second conductive layer 18 is formed over the entire surface of the substrate 10, so that the second conductive layer 18 covers an upper surface of the second insulating layer 16*b* and the gate pattern 14. The second conductive layer 18 comprises a polysilicon layer deposited, for example, to a thickness of from about 300 Å to about 500 Å using a CVD process. The material of the second conductive layer 18 may vary, though, in accordance with the material of the gate pattern 14. Also, the surface of the second insulating layer 16*b* may be rinsed before the second conductive layer 18 is formed, to thereby remove residuals of the wet etching process. An aqueous detergent solution that is environmentally-friendly may be used to rinse the second insulating layer 16*b*.

Figure 1F:
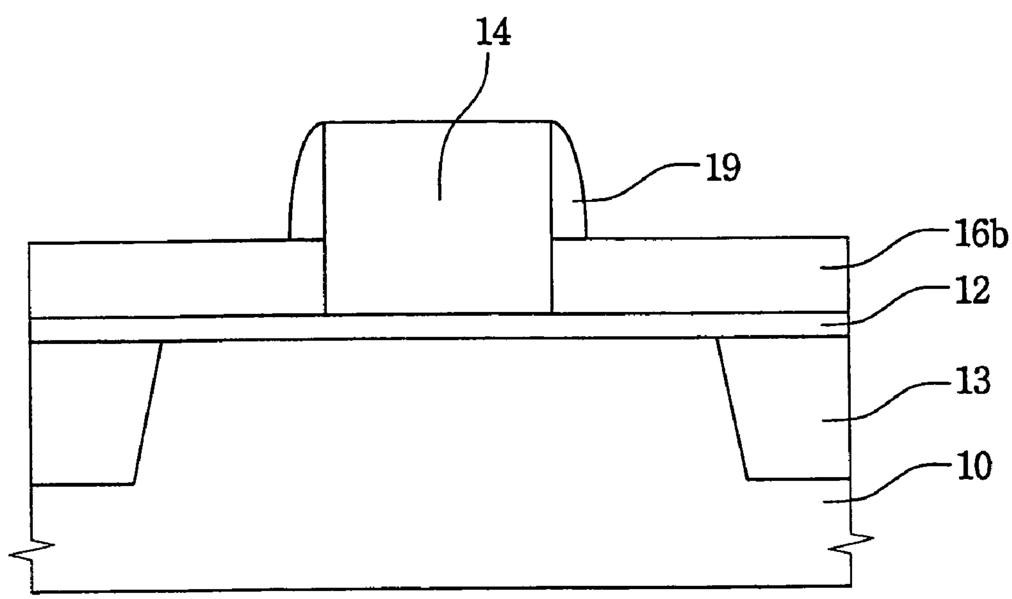

Referring to FIG. 1F, the second conductive layer 18 is anisotropically etched by a dry etching process, thereby forming a first spacer 19 on an upper side portion of the gate pattern 14. Therefore, the effective surface area of the top of the gate pattern 14 is enlarged by the first spacer 19. Hereinafter, the gate pattern 14 and first spacer 19 will be collectively referred to as a surface-enlarged gate pattern and, more specifically, as a surface-enlarged gate poly when the surface-enlarged gate pattern comprises polysilicon. It should be clear, then, that the surface-enlarged gate poly provides a relatively large contact area for the silicide metal, whereby the polycide is sure to have the desired resistive characteristic.

Figure 1G:
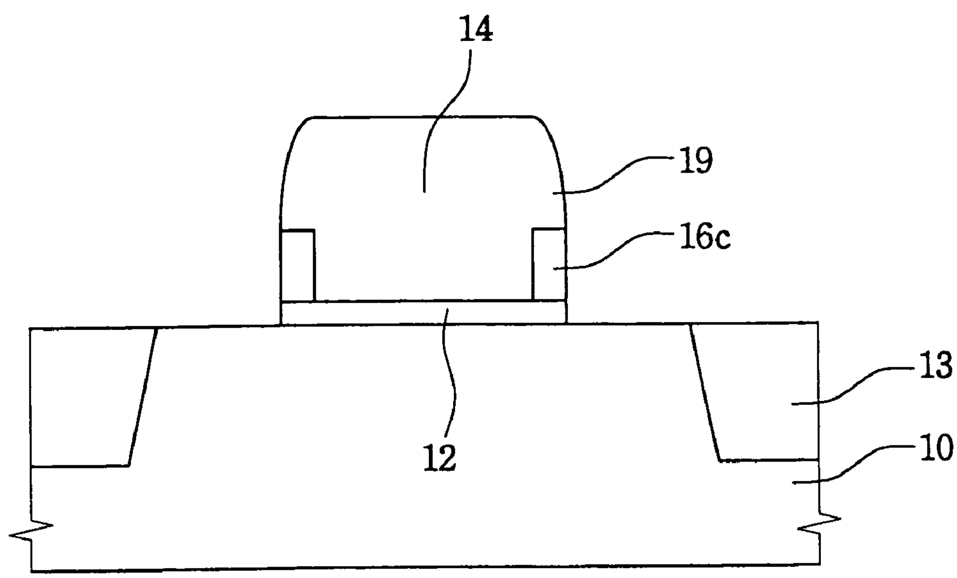

Referring to FIG. 1G, the second insulating layer 16*b* is removed by a dry etching process using the surface-enlarged gate pattern as an etching mask so that only a portion of the second insulating layer 16*c* remains as interposed between the first spacer 19 and the first insulating layer 12 at the bottom portion of the gate pattern 14. The remaining second insulating layer 16*c* ensures that ions implanted during an ion implantation process for forming source and drain electrodes remain as far away from the gate pattern 14 as possible. That is, the remaining second insulating layer 16*c* prevents the dopants for forming the source and drain electrodes from diffusing to a portion of the substrate 10 under the gate pattern 14.

Also, as shown in FIG. 1G, the first insulating layer 12 is removed together with the second insulating layer 16*b*. In fact, maintaining the first insulating layer 12 is expensive and difficult in view of the fact that the first insulating layer 12 is thinner than the targeted second insulating layer 16*b*. However, the first insulating layer 12 does not have to be removed along with the etched second insulating layer 16*b*, especially when the efficiency of the etching process does not depend on the removal of the first insulating layer 12.

Figure 1H:
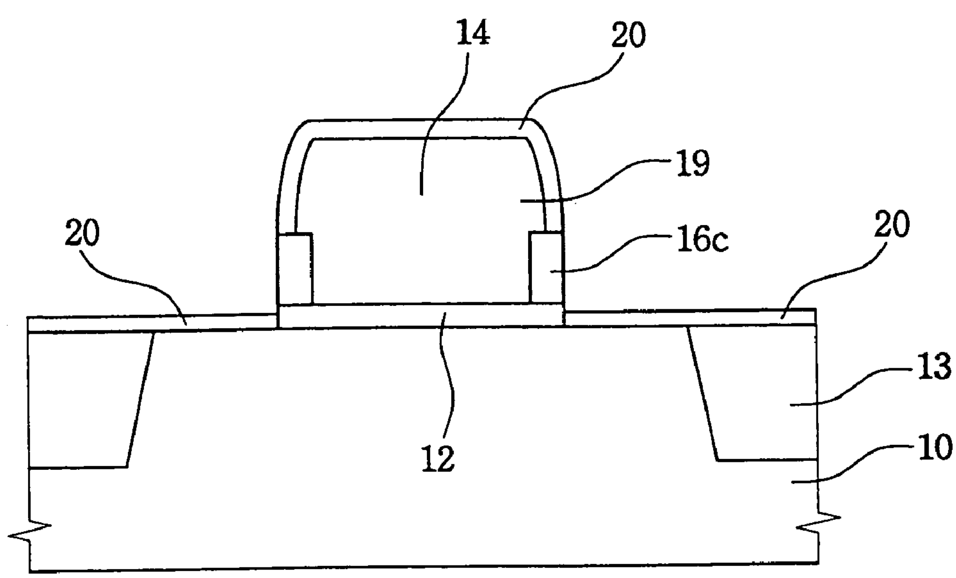

Referring to FIG. 1H, a third insulating layer 20 is formed over the entire surface of the substrate 10. The third insulating layer 20 may be an oxide layer so as to function similarly to the first insulating layer 12. The oxide of the third insulating layer 20 grows inwardly rather than outwardly on the surface-enlarged gate poly because the oxide has a tendency to grow downwardly rather than upwardly on a silicide layer. The oxide layer 20 grows on the substrate 10 to the same height of the first insulating layer 12 because the third insulating layer 20 comprises the same material of the first insulating layer 12.

Figure 1I:
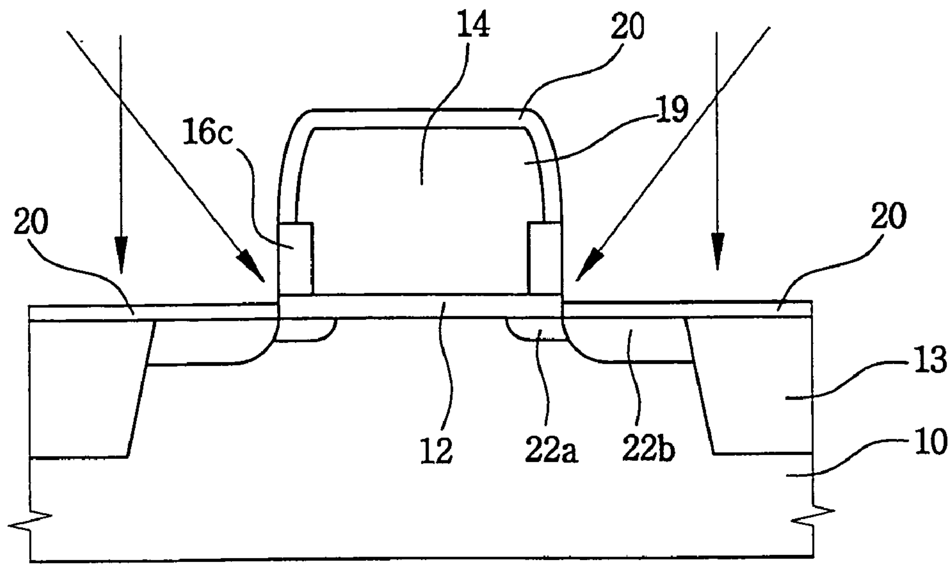

Referring to FIG. 1I, a diffusion-preventing layer 22*a* is formed by implanting diffusion-preventing ions under the gate electrode. The diffusion-preventing ions are for preventing dopants, subsequently implanted for forming the source and drain electrodes, from diffusing to the channel region under the gate electrode. To this end, the diffusion-preventing ions are implanted at a predetermined angle with respect to the surface of the substrate 10. As an example, the diffusion-preventing ions are implanted to the left of the surface-enlarged gate poly at an angle in a range of about 30° to about 45° clockwise with respect to the surface of the substrate 10, and are also implanted to the right of the surface-enlarged gate poly at an angle in a range of about 30° to about 45° counterclockwise with respect to the surface. The diffusion-preventing ions may be ions of germanium (Ge), phosphor (P), silicon (Si), and indium (In).

Next, using the surface-enlarged gate poly as a mask, the dopants for forming the source/drain electrodes are implanted substantially at a right angle with respect to the surface of the substrate 10. Accordingly, a source/drain region is formed on each side of the surface-enlarged gate poly by the ion implantation process. The dopants include elements of group III or Ï of the periodic table. In particular, the dopants are implanted at a low density near the gate electrode, thereby forming a lightly doped source/drain region 22*b*, to thereby minimize the chances for creating a short channel effect and overlay parasitic capacitance. Also, an optional extension process may be performed on the source/drain region for ensuring a more satisfactory flow of electrons toward the channel region.

Figure 1J:
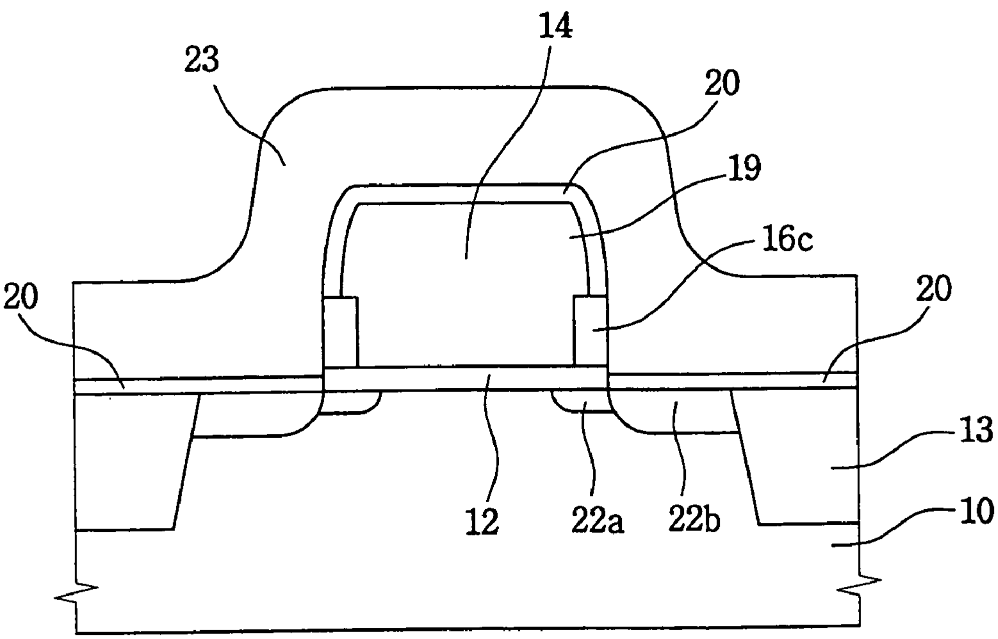
Figure 1K:
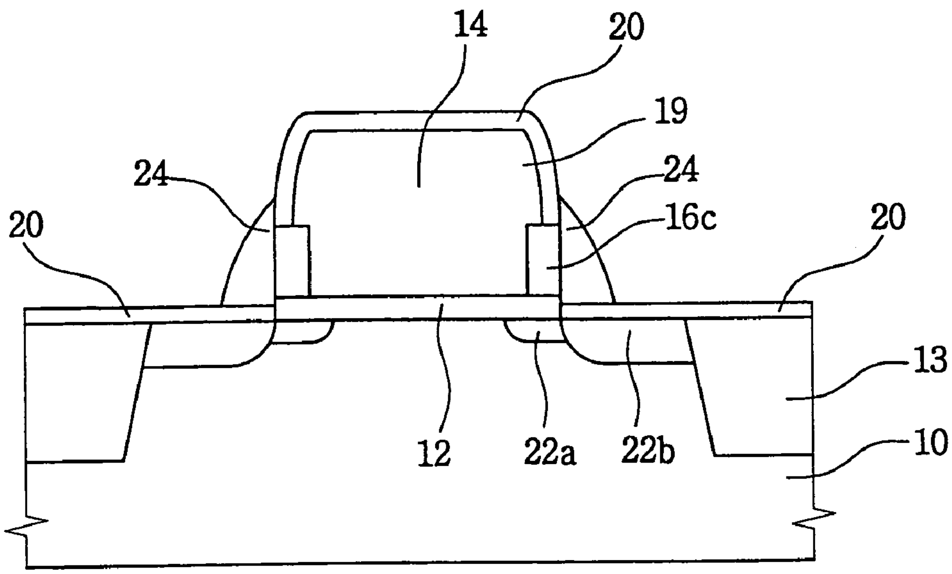

Referring to FIG. 1J, a fourth insulating layer 23 is formed on the substrate 10 and thus, the third insulating layer 20 and the surface-enlarged gate poly are covered with the fourth insulating layer 23. The fourth insulating layer 23 may be a silicon nitride ($Si_3N_4$) layer formed on the substrate using a conventional CVD or PVD process. As shown in FIG. 1K, the fourth insulating layer 23 is selectively dry etched so that a second spacer 24 is formed at both sides of a lower portion of the surface-enlarged gate poly.

Figure 1L:
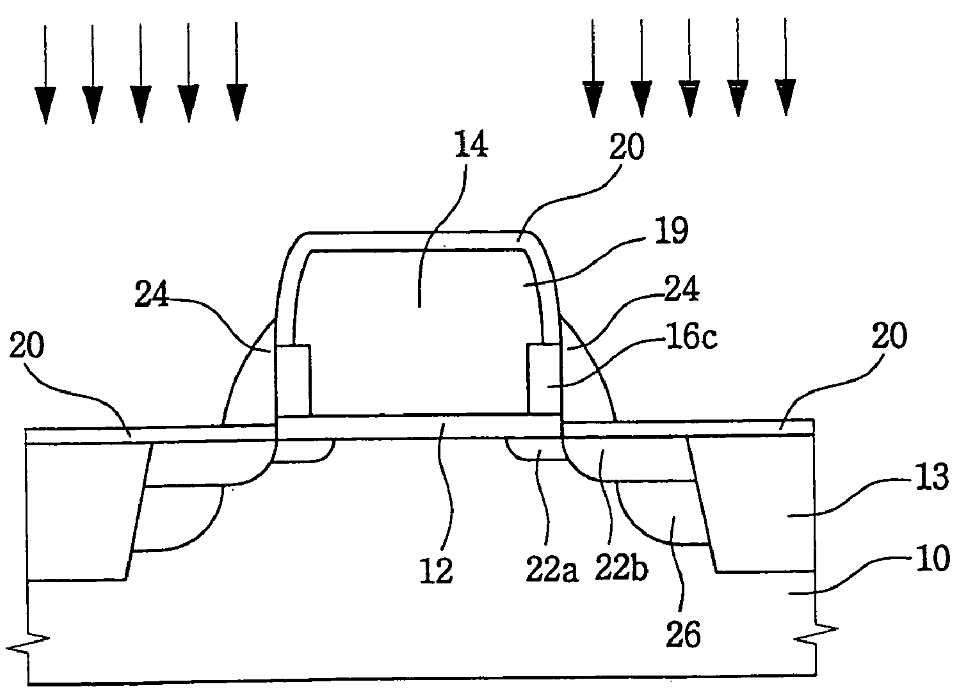

Referring to FIG. 1L, dopants for forming a source/drain region are implanted at a high density using the surface-enlarged gate poly and second spacer 24 as masks. The heavily doped source/drain region 26 is formed beneath the third insulating layer 20 to the side of the second spacer 24.

Subsequently, the substrate is heat-treated so that the dopants are chemically bonded to the substrate with sufficient stability. During the heat treatment, the dopants used to form a source/drain region usually diffuse toward the gate electrode. However, according to the present invention, the dopants hardly reach the gate electrode because the implanted dopants are spaced from sidewalls of the gate electrode by an amount corresponding to the thickness of the remaining second insulating layer and the second spacer. Accordingly, parasitic capacitance is minimized and hence, the resultant semiconductor device does not operate with a long time delay.

In particular, the thickness of the second insulating layer 16*c* is dependent on the desired thickness of the second conductive layer 18. Moreover, some overlay parasitic capacitance is allowed for in the designing of the integrated circuit. However, the amount of overlay parasitic capacitance can not be predetermined because many factors influence the diffusion of the dopants, i.e., too much uncertainty is associated with the diffusion of the dopants. In any case, the remaining second insulating layer 16*c* of the present invention can diminish the uncertainty associated with the diffusion of the dopants. Specifically, the overlay parasitic capacitance will hardly have an influence on the functional characteristics of the device when the remaining second insulating layer 16*c* is formed to a sufficient thickness. That is, the thickness of the remaining second insulating layer 16*c* corresponds to a factor by which the effect of the overlay parasitic capacitance on the operation of the device is mitigated. In this respect, the thickness of the remaining second insulating layer 16*c* can be based just on the deposition thickness of the second conductive layer 18, and can be easily regulated during the manufacturing process.

Figure 1M:
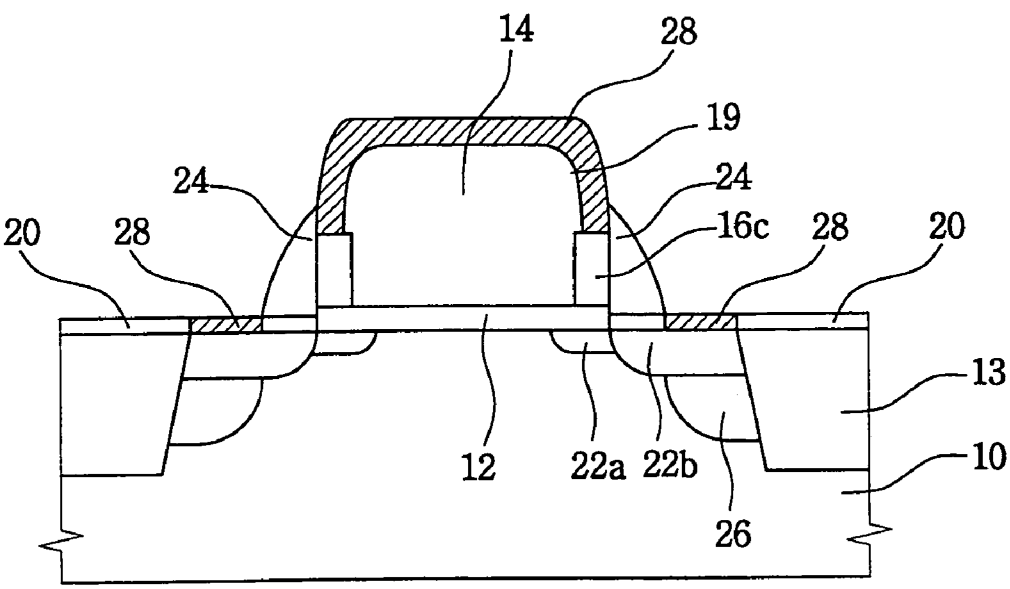

Next, as shown in FIG. 1M, a silicide process for improving the resistance characteristic of the semiconductor device is performed. More specifically, the third insulating layer 20 is selectively etched, and a portion of the substrate 10 corresponding to the source/drain region (hereinafter, referred to as source/drain substrate) is exposed. Then, a silicide layer is formed on the upper surface of the surface-enlarged gate poly and on the source/drain substrate, and a heat treatment is performed. As an example, the silicide layer is a refractory metal silicide layer comprising a metal such as cobalt (Co), tungsten (W) or titanium (Ti). As a result, the line resistance of the surface-enlarged gate poly and contact resistance of the source/drain resistance are reduced and, in turn, the operating speed of the semiconductor device is improved.

Finally, note, although the method of the present invention has been described above in connection with the manufacturing of a MOS-FET, the method of the present invention may also be applied to the manufacturing of a complementary MOS-FET as would be readily apparent to those of the ordinary skill in the art.

According to the present invention, as described above, wings in the form of a spacer are formed on both sides of an upper portion of the gate electrode. Thus, the wings enlarge the surface area of the exposed conductive material. Therefore, a silicide layer can make stable contact with the gate electrode, and a polycide layer can not reduce the electrical resistance at the gate electrode even when the gate length is on a sub-micron scale. In addition, an insulating layer serves as a capacitance controller at both sides of the lower portion of the gate electrode. Thus the parasitic capacitance between the gate electrode and substrate can be minimized. Accordingly, the time delay, as an inherent characteristic of the semiconductor device, can be shortened.

Finally, although the present invention has been described above in connection with the preferred embodiments thereof, the present invention is not limited as will be apparent to those skilled in the art. Rather, various changes to and modifications of these embodiments are within the true spirit and scope of the present invention as hereinafter claimed.

What is claimed is:

1. A method of forming a gate structure of a semiconductor device, comprising:

forming a first insulating layer on a substrate, subsequently coating the substrate with a conductive material, and patterning the conductive material to form at least one gate pattern insulated from the substrate by the first insulating layer;

forming a second insulating layer on the gate pattern and the substrate;

removing some of the second insulating layer until an upper surface thereof is below a level of an upper surface of the gate pattern;

forming a second conductive layer comprising the conductive material on the second insulating layer and the gate pattern;

selectively removing portions of the second conductive layer such that the second insulating layer is exposed, so that a spacer of the conductive material is formed at both sides of an upper portion of the gate pattern and a surface area of the gate pattern is enlarged; and subsequently removing a first portion of the second insulating layer, while leaving a second portion of the second insulating layer intact.

2. The method of forming a gate structure of claim 1, wherein said forming of the first insulating layer comprises forming an oxide layer on the substrate, and said coating the substrate with conductive material comprises forming a layer of polysilicon over the oxide layer.

3. The method of forming a gate structure of claim 1, wherein said forming of the second insulating layer comprises forming a low-temperature oxide layer on the gate pattern.

4. The method of forming a gate structure of claim 3, wherein the low-temperature oxide layer is formed by a high-density plasma chemical vapor deposition (CVD) process.

5. The method of forming a gate structure of claim 4, wherein the low-temperature oxide layer is formed to a thickness of about 3000 Å.

6. The method of forming a gate structure of claim 1, wherein said removing some of the second insulating layer comprises planarizing the second insulating layer, and subsequently etching the second insulating layer.

7. The method of forming a gate structure of claim 6, wherein the planarizing of the second insulating layer comprises chemically mechanically polishing the second insulating layer until the upper surface thereof is situated about 700 Å over the upper surface of the gate pattern.

8. The method of forming a gate structure of claim 6, wherein said subsequent etching of the second insulating layer comprises wet etching the second insulating layer until the thickness thereof is about 900 Å.

9. The method of forming a gate structure of claim 8, wherein said wet etching of the second insulating layer is carried out using a limulus amoebocyte lysate (LAL) solution.

10. The method of forming a gate structure of claim 6, further comprising rinsing residuals of the second insulating layer, produced as a result of said etching thereof, before the second conductive layer is formed.

11. The method of forming a gate structure of claim 1, wherein the second conductive layer is formed to a thickness of about 300 Å to about 500 Å using a chemical vapor deposition (CVD) process.

12. The method of forming a gate structure of claim 1, wherein said removing portions of the second conductive layer comprises an anisotropic etching process.

13. The method of forming a gate structure of claim 12, wherein the removing portions of the second insulating layer is carried out using the spacer as a mask, so that the second insulating layer only remains at both sides of a lower portion of the gate pattern beneath the spacer.

14. The method of forming a gate structure of claim 13, further comprising forming a silicide layer on the gate pattern and the spacer.

15. A method of fabricating a semiconductor device, comprising:

forming a first insulating layer on a substrate, subsequently coating the substrate with a conductive material, and patterning the conductive material to form at least one gate pattern insulated from the substrate by the first insulating layer;

forming a second insulating layer on the gate pattern and the substrate;

removing some of the second insulating layer until an upper surface thereof is below a level of an upper surface of the gate pattern;

forming a second conductive layer comprising the conductive material on the second insulating layer and the gate pattern;

selectively removing portions of the second conductive layer such that the second insulating layer is exposed, so that a first spacer of the conductive material is formed at both sides of an upper portion of the gate pattern, and a surface area of the gate pattern is enlarged;

subsequently removing the second insulating layer except at portions adjacent both sides of a lower portion of the gate pattern;

subsequently implanting ions, at a relatively low concentration, into the substrate at both sides of the gate pattern using the gate pattern as a mask, to thereby form a lightly doped source/drain region on the substrate;

subsequently forming a fourth insulating layer on the substrate including the gate pattern;

selectively removing portions of the fourth insulating layer to thereby form a second spacer at the sides of the gate pattern;

subsequently implanting ions, at a concentration higher than that of said relatively low concentration, into the substrate corresponding at both sides of the gate pattern using the gate pattern and the second spacer as a mask, to thereby form a heavily doped source/drain region on the substrate;

subsequently performing a heat treatment on the substrate; and forming a third conductive layer on the gate pattern and on the heavily-doped source/drain region.

16. The method of fabricating a semiconductor device of claim 15, wherein said forming of the first insulating layer comprises forming an oxide layer on the substrate, and said coating the substrate with conductive material comprises forming a layer of polysilicon over the oxide layer.

17. The method of fabricating a semiconductor device of claim 15, wherein said forming of the second insulating layer comprises forming a low-temperature oxide layer on the gate pattern.

18. The method of fabricating a semiconductor device of claim 15, wherein said removing some of the second insulating layer comprises planarizing the second insulating layer, and subsequently etching the second insulating layer.

19. The method of fabricating a semiconductor device of claim 18, wherein the second insulating layer is planarized by a chemical mechanical polishing process, and etched away through a wet etching process.

20. The method of fabricating a semiconductor device of claim 19, further comprising rinsing residuals of the second insulating layer, produced as a result of said etching thereof, before the second conductive layer is formed.

21. The method of fabricating a semiconductor device of claim 15, wherein the second conductive layer is formed to a thickness of about 300 Å to about 500 Å using a chemical vapor deposition (CVD) process, and said removing portions of the second conductive layer comprises an anisotropic etching process.

22. The method of fabricating a semiconductor device of claim 21, wherein the second insulating layer is etched using the first spacer as a mask, so that the second insulating layer only remains at both sides of a lower portion of the gate pattern.

23. The method of fabricating a semiconductor device of claim 15, wherein portions of the first insulating layer are removed in said removing of the second insulating layer except at portions adjacent both sides of a lower portion of the gate pattern, whereby the surface of the substrate is exposed, and further comprising forming a third insulating layer on exposed portions of the substrate before the lightly-doped source/drain region is formed.

24. The method of fabricating a semiconductor device of claim 23, wherein said forming of the third insulating layer comprises forming an oxide layer on the exposed portions of the substrate using a CVD process or a physical vapor deposition (PVD) process.

25. The method of fabricating a semiconductor device of claim 15, further comprising implanting anti-diffusion ions into the substrate at both sides of the gate pattern before said implanting of the ions at said relatively low concentration, to thereby prevent the subsequently implanted ions from diffusing to a region under the gate pattern.

26. The method of fabricating a semiconductor device of claim 25, wherein the anti-diffusion ions are selected from the group consisting of germanium (Ge), phosphor (P), silicon (Si) and indium (In) ions.

27. The method of fabricating a semiconductor device of claim 25, wherein the anti-diffusion ions are implanted into the substrate at both sides of the gate pattern at acute angles with respect to the upper surface of the substrate, respectively.

28. The method of fabricating a semiconductor device of claim 27, wherein the anti-diffusion ions are implanted into the substrate at a left side of the gate pattern at an angle in a range from about 30° to about 45° measured clockwise from the upper surface of the substrate, and are implanted into the substrate at a right side of the gate pattern at an angle in a range from about 30° to about 45° measured counterclockwise from the upper surface of the substrate.

29. The method of fabricating a semiconductor device of claim 15, wherein said implanting of ions to form the lightly- and heavily- doped regions is carried out at an angle of about 90° with respect to the substrate.

30. The method of fabricating a semiconductor device of claim 15, wherein said forming of the fourth insulating layer on the substrate comprises forming a nitride layer using a CVD or a PVD process over the gate pattern.

31. The method of fabricating a semiconductor device of claim 15, wherein said forming of the third conductive layer comprises forming a metal layer on the gate pattern and on the heavily-doped source/drain region, and subsequently heat-treating the substrate to produce a chemical reaction between the metal layer and the conductive material of the gate pattern.

32. The method of claim 1, wherein the second portion of the second insulating layer is interposed between the spacers and the first insulating layer.

33. The method of claim 1, further comprising forming a third insulating layer over the entire substrate.

34. The method of claim 33, wherein said forming of the third insulating layer comprises forming an oxide layer on the exposed portions of the substrate using a CVD process or a physical vapor deposition (PVD) process.

35. The method of claim 33, further comprising forming a fourth insulating layer on the substrate.

36. The method of claim 35, wherein the fourth insulating layer covers the third insulating layer and the gate pattern.

37. The method of claim 36, further comprising selectively removing portions of the fourth insulating layer.

38. The method of claim 15, wherein the portions of the second insulating layer adjacent both sides of the lower portion of the gate pattern extend between the first spacers and the first insulating layer.

* * * * *